United States Patent

Assour et al.

[15] 3,659,222

[45] Apr. 25, 1972

[54] HIGH EFFICIENCY MODE AVALANCHE DIODE OSCILLATOR

[72] Inventors: Jacques Mayer Assour, Princeton, N.J.; Arye Rosen, Elkens Park, Pa.; James Francis Reynolds, Cranbury, N.J.

[73] Assignee: RCA Corporation

[22] Filed: Sept. 1, 1970

[21] Appl. No.: 68,671

[52] U.S. Cl. ............................331/99, 331/101, 331/107 R, 331/177 V

[51] Int. Cl. ............................H03b 7/14

[58] Field of Search..............331/96, 99, 101, 107 R, 177 V, 331/107 G

[56] References Cited

UNITED STATES PATENTS 3,336,535 8/1967 Mosher..............................331/99 X

OTHER PUBLICATIONS

Kuno et al., " Push–Pull Operation of Transferred–Electron Oscillators," Electronics Letters, 1 May 1969, pp. 178–179

*Primary Examiner*—Roy Lake
*Assistant Examiner*—Siegfried H. Grimm
*Attorney*—Edward J. Norton

[57] ABSTRACT

A high efficiency mode avalanche diode oscillator is disclosed. The avalanche diode and a tuning capacitor are connected in parallel at a high microwave voltage point at one end of a resonant transmission line section electrically one-eighth wavelength long at the operating frequency of the oscillator, so as to match the complex impedance of the diode to a load impedance, and to provide the high efficiency mode of operation.

3 Claims, 4 Drawing Figures

INVENTORS.
Jacques M. Assour,
Arye Rosen and
James F. Reynolds.
BY
Edward J. Norton
ATTORNEY

HIGH EFFICIENCY MODE AVALANCHE DIODE OSCILLATOR

DESCRIPTION OF PRIOR ART

Techniques previously used in the construction of high efficiency mode avalanche diode oscillators have resulted in oscillator structures difficult to design and tune. The oscillator usually is formed by an arrangement including a low pass filter in series with a parallel combination of avalanche diode and shunt capacitance. The series connected low pass filter or other reactive impedance device is empirically positioned, so that a high microwave voltage point is established in the vicinity of the avalanche diode. The low pass filter also matches the complex impedance of the diode and reflects frequencies higher than the fundamental frequency of oscillation. Among the problems associated with this type of oscillator design is the fact that the procedure for tuning the low pass filter to the fundamental frequency of operation, also changes the impedance match of the diode. A possible mismatch of the diode results in a loss of output power. Also, the experimental determination of where a high microwave voltage point is located along the transmission line is changed as the low pass filter is tuned.

SUMMARY OF THE INVENTION

It is an object of the present invention to provide an improved microwave circuit for high efficiency mode avalanche diode oscillators.

An avalanche diode is shunt connected at a high microwave voltage point at one extremity of a capacitively tuned, resonant transmission line section. The resonant transmission line section has an electrical length of one-eighth wavelength at the operating frequency of the oscillator and is designed to reflect all frequencies higher than the fundamental frequency of operation. A tuning capacitor is located at the same extremity of the resonant transmission line as the avalanche diode and is connected in parallel with the diode. One of the functions of the tuning capacitor is to store the energy present at the reflected frequencies, and when charged to a critical value, to trigger the high efficiency mode of operation of the avalanche diode. The combination of tuning capacitor and the characteristic impedance of the resonant transmission line match the complex impedance of the avalanche diode to a load impedance.

DESCRIPTION OF THE DRAWING

Figure 1:
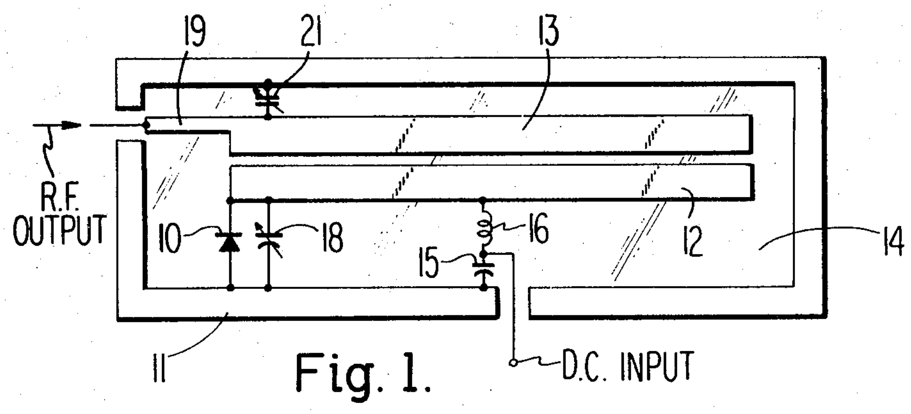
FIG. 1 is a schematic diagram of a high efficiency mode avalanche diode oscillator utilizing the novel features of the present invention.
Figure 2:
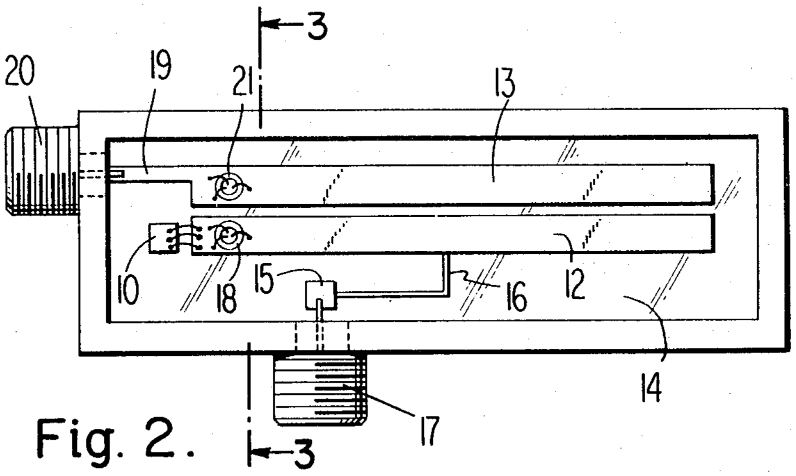
FIG. 2 is a top, pictorial view of a high efficiency mode avalanche diode oscillator constructed in the manner of that shown schematically in FIG. 1.
Figure 3:
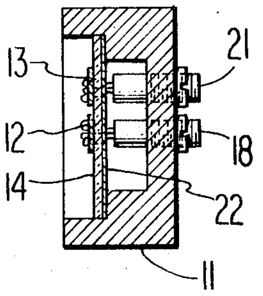
FIG. 3 is a sectional view taken along line 3—3 in FIG. 2.

Referring now to FIGS. 1, 2, and 3, there is shown a high efficiency mode avalanche diode oscillator including the associated microwave circuitry. The avalanche diode 10 has the capability of converting DC power into microwave power, due to the properties of the semiconductive device. The microwave circuitry uses the techniques of microstrip for the transmission of microwave energy, and includes an input resonant transmission TEM line section, referred to as the input microstrip resonator 12. The input microstrip resonator 12 is etched or otherwise formed on the top surface of a dielectric substrate 14. The bottom surface of the dielectric substrate is metal clad to provide a ground planar conductor 22. The conductor 22 is electrically connected to a conductive housing 11 which serves as a ground plane. At the extremities of the input microstrip resonator 12 there exist high microwave voltage points. It is at one of these extremities that the a valanche diode 10 is connected in shunt with a charge storage device 18. The other end of the input microstrip resonator 12 is, in the embodiment shown in FIGS. 1, 2 and 3, open circuited.

A DC bias voltage is supplied to the oscillator via a coaxial connector 17. The bias voltage is applied to the resonator 12 via a circuit including the series combination of a RF bypass capacitor 15 and high inductance lead 16, the center conductor of the coaxial line being connected to the junction of the capacitor 15 and inductor 16. The biasing circuit will present a high impedance at microwave frequencies, therefore, isolating a microwave signal from the DC source. To further reduce coupling of microwave energy by the biasing circuit and to provide minimum interference with the microwave circuitry, the high inductance lead 16 is connected to the input microstrip resonator 12 at a microwave voltage null point.

The DC bias voltage causes a displacement current or electric field in the depletion layer of the semi-conductor material of the diode 10. At the point of maximum electric field, the carriers are ionized. The ionized carriers travel at a saturation velocity, and upon impact with other atoms, create more carriers or increase the carrier density. The displacement current can also be considered as a wave front, moving with a specific wave velocity, provided the displacement current has a very fast rise time. If the wave velocity is greater than the saturation velocity of the carriers, a high density of electrons will be left in the wake of this wave front. As a result of the concentration of electrons, the electric field is reduced and the velocity of the carriers is diminished leading to the formation of a dense plasma. Microwave power is obtained from an avalanche diode 10 by extraction of energy from the trapped plasma.

The necessary fast rise time of the displacement current can be achieved by reflecting the high frequency signals created by ionization at low currents, and storing the energy contained in these signals in the parallel combination of avalanche diode 10 and charge storage device 18. After the charge storage device 18 is charged toward its critical value, it triggers the avalanche diode 10 into a high efficiency mode of operation, the anomalous mode, by discharging its stored charge into the avalanche diode 10. The avalanche diode 10, in turn, emits energy at a frequency which is related to the ratio of the depletion layer width to the velocity of the carriers in the plasma. The input microstrip resonator, including the parallel combination of avalanche diode and charge storage device, is resonant at this frequency of oscillation and will pass the resultant microwave power with little or no attenuation.

A second resonant transmission TEM line section or output microstrip resonator 13 is etched or otherwise formed on the top surface of the dielectric substrate, and is terminated at one end by a charge storage device 21. The other end of the output microstrip resonator 13 is, in the embodiment shown in FIGS. 1, 2 and 3, open circuited. The input and output resonators 12 and 13 are aligned end-to-end and in parallel to define opposite halves of a rectangle. The separation between resonators simulates the windings on a transformer and helps to transform the relatively low complex impedance of the avalanche diode 10 to a higher load impedance. The load impedance, not shown, is connected to the output coaxial connector 20 which is, in turn, coupled to the output resonator 13, for example, by a 50 ohm microstrip transmission line 19.

The electrical length of the microstrip resonators 12 and 13 is dependent on the magnitude of the respective terminating charge storage devices. The resonant frequency of the microstrip resonators 12 and 13 is inversely proportional to their electrical length. Thus, the resonant frequency of the microstrip resonators 12 and 13 can be tuned by varying the magnitude of the respective charge storage devices 18, 21.

An additional charge storage device may be added in shunt to the open circuited end of each microstrip resonator 12 and 13. Such additional charge storage devices can be used to extend the range of impedance match achieved by the capacitors 21 and 18, while maintaining the electrical length of the resonators 12, 13 one-eighth of a wavelength over the tuning range of the capacitors 18, 21. The problem of terminating the avalanche diode 10 in a reactive load at the high frequencies produced by the diode is solved by making the physical length of the resonators less then one-eighth of a wavelength at the fundamental frequency of oscillation. Since the resonators are electrically short, they will not be cyclically resonant at an important harmonic frequency, but will present a reactive load to the avalanche diode 10 at these higher frequencies. The reactive load will reflect the high frequency energy back to the avalanche diode where it will be stored in the charge storage device.

Figure 4:
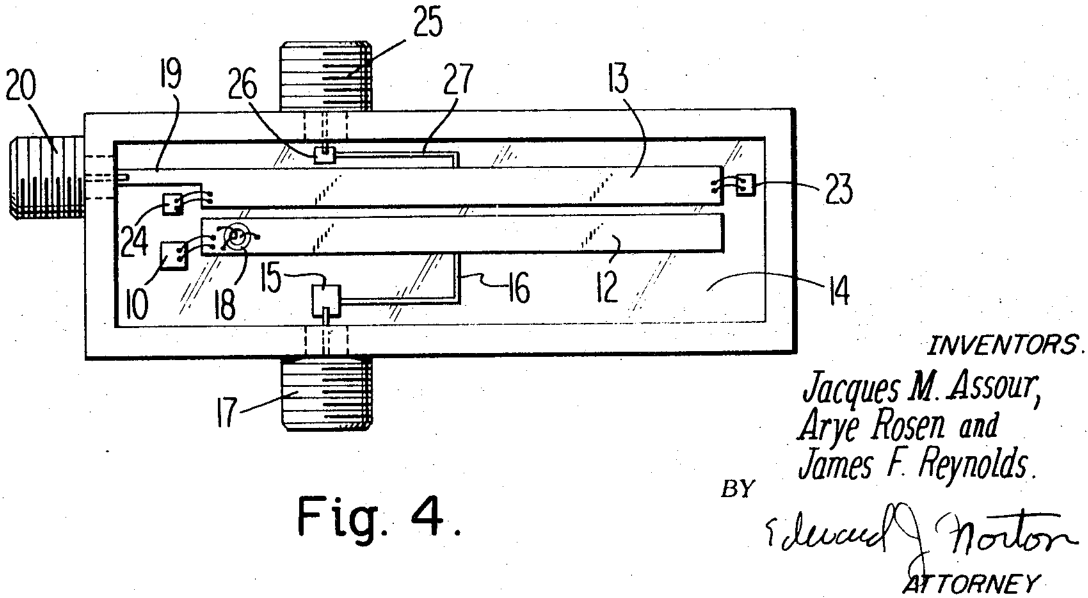
FIG. 4 is a top view of a further embodiment of a high efficiency mode avalanche diode oscillator according to the present invention, using a voltage variable capacitance for electronic tuning.

A further embodiment of an avalanche diode oscillator, in accordance with the present invention, is described with reference to FIG. 4. The same reference numerals used to describe FIGS. 1, 2 and 3 will be used to describe FIG. 4. The approach for generating microwave energy, and matching the complex impedance of the avalanche diode 10 by the use of coupled microstrip resonators is the same. The difference is that the output microstrip resonator 13 has an RF short circuit at one extremity, and is terminated by a voltage variable capacitor 24 at the other end. The RF short circuit is constructed by connecting an RF bypass capacitor 23 to ground from the resonator 13. A bias voltage is fed via coaxial connector 25 across the voltage variable capacitor 24, through a series combination of RF bypass capacitor 26, and high inductance wire 27 connected to the output microstrip resonator 13 at a microwave voltage null point. It is to be understood that capacitors 23 and 24 are connected to the housing ground 11 as by a lead on the back side of substrate 14 or other suitable means. The capacitance value of the voltage variable capacitor 24 is changed as the magnitude of the bias voltage is varied. The changing capacitance value varies the electrical length of the output microstrip resonator 13 and thus the output frequency of the microwave oscillator can be electrically tuned.

For purposes of this description, capacitors 18 and 21 are shown in the drawing as being of a type wherein one end thereof is electrically, conductively secured to the housing 11 in the manner shown in FIG. 3. The contact terminal at the other end of the respective capacitors 18, 21 is shown as extending through a hole in the conductor 22, the substrate 14 and the transmission resonator line sections 12 and 13, the contact terminal of the capacitors 18, 21 being electrically connected to the respective line sections 12, 13 by whisker wires or other suitable means. In practice, the capacitors 18, 21 can take any one of several forms. Thus, they could be mounted to the housing 11 and parallel to and on the same side of the substrate 14 as the line sections 12, 13. Chip capacitors could be formed on or as part of the line sections 12, 13 with a wire connection from one terminal thereof to the housing ground. The particular technique used can be determined according to the application, and is not limited by the present invention.

In an oscillator constructed according to the arrangement of FIG. 1, the oscillator used a 30 mil. silicon avalanche diode and was designed to operate at 0.880 gHz., yielding 220 watts of peak output power with 29 percent efficiency. The oscillator operating in L-band was mounted in a box 1½ inches long, 2 inches wide and ⅝ inch high.

A preferred embodiment of the invention has been shown and described. Various other embodiments and modifications thereof will be apparent to those skilled in the art, and will fall within the scope of invention as defined in the following claims.

What is claimed is:

1. In a microwave oscillator of the type having a negative resistance active device operating in the anomalous mode and at least one microwave resonant structure including a transmission line section tuned by at least one charge storage device for determining the operating frequency of said oscillator, the improvement comprising:

means for coupling said negative resistance active device to said transmission line section at a high microwave voltage point on said transmission line section, said transmission line being substantially electrically one-eighth wavelength long at said operating frequency, means for terminating an end of said resonant transmission line section by said charge storage device connected at a high microwave voltage point on said resonant transmission line section in shunt with said negative resistance active device to cause said charge storage device to store charge from the reflection of energy by the combination of resonant transmission line section and charge storage device at frequencies different from said operating frequency.

2. The microwave oscillator according to claim 1, further comprising: an output means coupled to said line section, the capacitance of said charge storage device being variable so as to tune the frequency of said resonant transmission line section and to match the impedance of said negative resistance active device to that of said output means.

3. The microwave oscillator according to claim 1, further comprising: a second resonant transmission line section, substantially electrically one-eighth wavelength long at said operating frequency, said second resonant transmission line section being terminated by a charge storage device at least at one end thereof, said first and second resonant transmission line sections being aligned end-to-end in parallel to define opposite halves of a rectangle with the separation between said resonant transmission line sections determining the impedance transformation from said negative resistance active device to an output load impedance coupled to said second resonant transmission line section.

* * * * *